United States Patent [19]
Henley

[11] Patent Number: 5,177,437
[45] Date of Patent: Jan. 5, 1993

[54] HIGH-DENSITY OPTICALLY-ADDRESSABLE CIRCUIT BOARD PROBE PANEL AND METHOD FOR USE

[75] Inventor: Francois J. Henley, Los Gatos, Calif.

[73] Assignee: Photon Dynamics, Inc., Milpitas, Calif.

[21] Appl. No.: 564,812

[22] Filed: Aug. 8, 1990

[51] Int. Cl.$^5$ .......................................... G01R 31/02
[52] U.S. Cl. .............................. 324/158 F; 324/73.1; 324/158 P; 324/158 R
[58] Field of Search ............... 324/158 F, 158 P, 73.1, 324/158 R, 96; 340/765, 784; 437/8

[56] References Cited

U.S. PATENT DOCUMENTS

| | | | |
|---|---|---|---|
| 4,507,605 | 3/1985 | Geisel | 324/158 F |
| 4,571,542 | 2/1986 | Arai | 324/158 F |
| 4,574,236 | 3/1986 | Hechtman | 324/158 F |
| 4,578,279 | 3/1986 | Zingher | 427/10 |
| 4,851,767 | 7/1989 | Halbout et al. | 324/158 P |

FOREIGN PATENT DOCUMENTS

| | | | |
|---|---|---|---|
| 0246726 | 10/1988 | Japan | 324/158 P |
| 0130132 | 5/1989 | Japan | 324/158 P |

OTHER PUBLICATIONS

Dodd et al.; "Printed-Circuit Tester"; IBM Tech. Dis. Bull.; vol. 16; No. 9; Feb. 1974 p. 2848.

Primary Examiner—Ernest F. Karlsen
Attorney, Agent, or Firm—Townsend and Townsend

[57] ABSTRACT

An apparatus for testing a circuit board is provided employing a probe panel having a high density of photoelectrically addressable electrodes, each of the electrodes being coupled to a photoelectric switch connected to an outside source such as a voltage strip, and further employing photoelectric means for selectively activating each photoelectric switch as desired to apply test signals to selected locations of a circuit board. In one embodiment, a light panel having an array of pixels having a form factor scalably matching the electrode array is used to activate the photoelectric switches. A second embodiment uses a second probe panel on the circuit board side opposite the first probe panel. The desired light panel is a liquid crystal display panel using a laser diode as a light source. Addressable light panels permit preprogrammed test patterns to be applied through a programmable signal driving device, such as a computer, that is programmed to light only those pixels desired to match the pattern of the printed circuit board under test. Since many printed circuit boards are first designed on a CAD system, the resultant design can be used as the data to define the test pattern for the circuit board. This arrangement allows a universal optically addressable probe panel to be used with any desired printed circuit board, and particularly, with a circuit board designed on a CAD system.

28 Claims, 7 Drawing Sheets

HIGH-DENSITY OPTICALLY-ADDRESSABLE CIRCUIT BOARD PROBE PANEL AND METHOD FOR USE

BACKGROUND OF THE INVENTION

This invention relates to an apparatus for testing circuit boards, and in particular, for testing a circuit board having a high density of probe points such as a multilayer printed circuit board or multi-chip module.

As the density of component placement on circuit boards increases, it is becoming more difficult to provide circuit board testing equipment which can match and test the boards as required.

Known probe panels use probe needles which are subject to additional problems such as breakage and wear. This results in lost productivity due to down time and also due to bad yields because of faulty test equipment. Problems may arise as integrated circuit technology reaches the point of fabricating components directly upon large circuit boards. Testing will require greater probe density than that presently available.

Current printed circuit board testing equipment, such as a "bed-of-nails" testing device, has a probe density limited to between 100 probes per square inch to 200 probes per square inch. In addition, each probe panel of the "bed-of-nails" testing device must be carefully designed to "match" the circuit board to be tested. The custom-designed probe panels, called "fixtures", represent a substantial cost of the testing device. Moreover, these fixtures are limited only to the particular circuit board for which they were designed.

Therefore, what is desired to overcome the problems cited above is a probe panel with densities higher than 200 probes per inch, that has improved reliability and that would be universally adaptable to any circuit board desired to be tested.

SUMMARY OF THE INVENTION

According to the present invention, an apparatus for testing a circuit board is provided employing a probe panel having a high density of photoelectrically addressable electrodes, each of the electrodes being coupled to a photoelectric switch connected to a low impedance line such as a metal strip, and further employing means for selectively photoelectrically activating each photoelectric switch as desired to apply or receive test signals to various locations of a circuit board through a conductive elastomeric mat or other suitable electrical interface.

In one embodiment, a light modulating valve having an array of pixels is used to activate the photoelectric switches. The desired light valve is a liquid crystal display projection panel having a laser diode light source. Addressable light valves permit preprogrammed test patterns to be applied through a programmable signal driving device, such as a computer, that is programmed to light only those pixels desired to match the pattern of the printed circuit board under test. Since many printed circuit boards are first designed on a CAD system, the resultant design can be used as the data to define the test pattern for the circuit board. This arrangement allows a universal optically addressable probe panel to be used with any desired printed circuit board, and particularly, with a circuit board designed on a CAD system.

In order to interface the surface of a circuit board under test with the photoelectrically addressable probe panel, an elastomeric conductive mat having electrically conductive filaments is provided that is sandwiched between the probe panel and the circuit board. The elastomeric mat allows each electrode from the probe panel to electrically connect to a location on the printed circuit board directly adjacent an electrode. The probe panel also includes means for measuring and recording the voltage applied to the circuit board by the photoelectrically addressable probe panel. The results of the test are provided by the probe panel to an analysis equipment, such as a computer-based automatic test equipment.

The dual function of sending and receiving data to and from the circuit board allows a probe panel to be positioned on both sides of the circuit board.

The invention will now be described, by way of example, with reference to the accompanying drawings.

DETAILED DESCRIPTION OF THE PREFERRED EMBODIMENT

Figure 1:
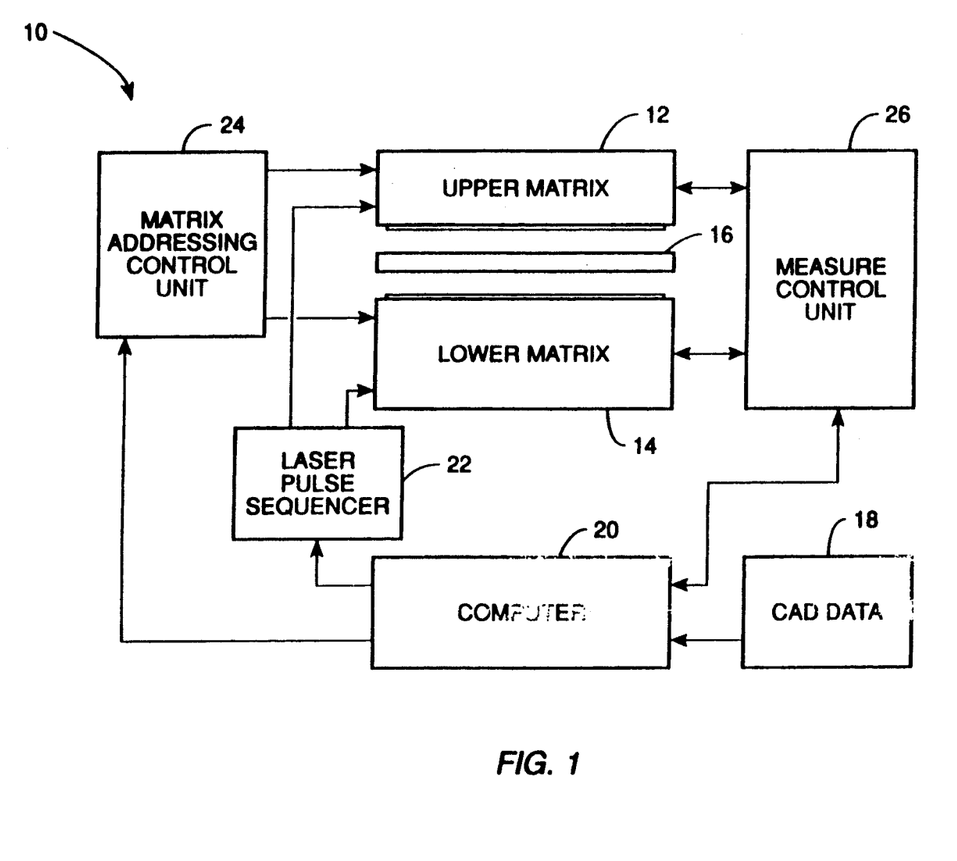
FIG. 1 is a block diagram of a probe panel system.

FIG. 1 is a block diagram of a high density photoelectrically-addressable bare board test system 10. Test system 10 includes an upper probe matrix 12 and a lower probe matrix 14 between which is positioned a bare or partially assembled circuit board 16. The design of the circuit board 16, preferably based on the computer-aided design (CAD) data 18 used to design the circuit board 16, is loaded into a computer 20. Computer 20 then uses the design data from CAD data 18 to operate both a laser pulse sequencer 22 and a matrix addressing control unit 24 which are then both used to drive both upper matrix 12 and lower matrix 14 for testing computer board 16. The test data from the testing performed on computer board 16 is received by both upper matrix 12 and lower matrix 14 and forwarded to a measure control unit 26. Measure control unit 26 then forwards the test results to computer 20 in preparation for the next testing sequence and for storage of the test results for later analysis and evaluation. A more complete description of how computer 20, laser pulse sequencer 22, matrix addressing control unit 24 and measure control unit 26 interact with upper probe matrix 12 and lower probe matrix 14 when testing circuit board 16 is provided below.

Figure 2:
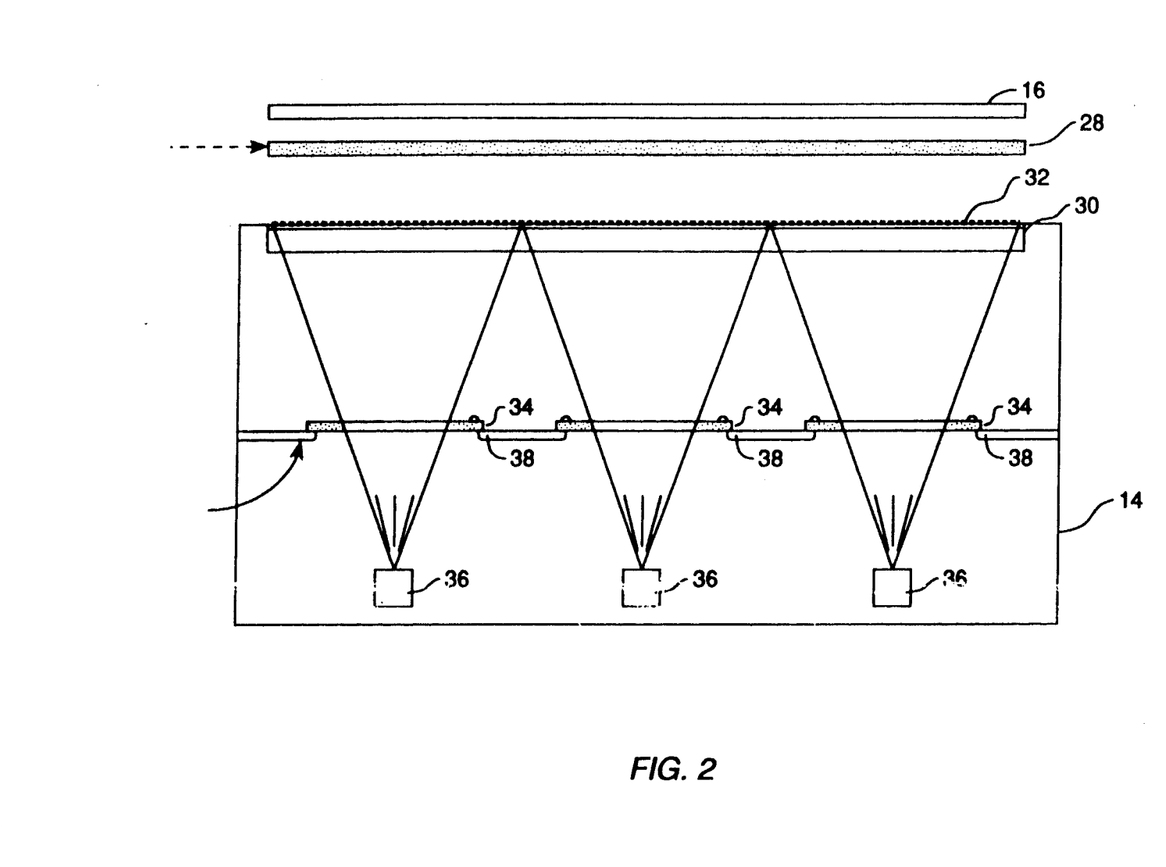
FIG. 2 is a cross-sectional expanded view of the conductive lower matrix panel according to the present invention.

FIG. 2 illustrates lower probe matrix 14 according to the present invention. Lower probe matrix 14 is identical to upper probe matrix 12, therefore, only a description of lower probe matrix 14 is given. Disposed between circuit board 16 and lower probe matrix 14 is an electro-conductive mat 28. Lower probe matrix 14 includes a flat glass plate 30 upon which is fabricated a node matrix 32. Node matrix 32 is photoelectrically activated via a light source exposed on the opposite side of glass plate 30. The light source used to activate node matrix 32 is provided from an image produced by a suitable light valve, such as a set of liquid crystal display (LCD) projection panels 34, through which is shone a light source, such as from a laser diode 36. Of course, other light source arrangements are possible, such as a single light diode for each electrode, an LCD panel with a back light source or a white light source with suitable optics and shutter. Mat 28 also serves to cushion both circuit board 16 and glass plate 30 from the pressure necessary to provide electrical contact between board 16 and plate 30.

One embodiment of the present invention uses only a single LCD projection panel 34 with a single laser diode 36. A preferred embodiment uses a plurality of LCD projection panels with a corresponding number of laser diodes 36 to photo-electrically activate node matrix 32. In this preferred embodiment of a plurality of LCD projection panels 34, a mounting frame 38 is provided to hold each LCD projection panel 34. The use of LCD projection panels allows the panels to be positioned away from the matrix panel. The light source light valve combination requires no optics to form the image on matrix panel. The use of this type of system eliminates any optical distortion and/or aberration common to optical-based systems. In addition, the projection system is easily scalable. By simply moving the light valve closer to or further from the matrix panel, the image is enlarged or reduced. LCD projection panels 34 also permit the edge of one image to precisely match, or even overlap, the edge of the adjacent image. Both of these advantages allow for full coverage of any size matrix panel.

Although it is disclosed to use two matrix panels above and below circuit board 16, it is well within the contemplation of the invention to use only a single matrix panel for use on a single sided circuit board 16.

Figure 3:
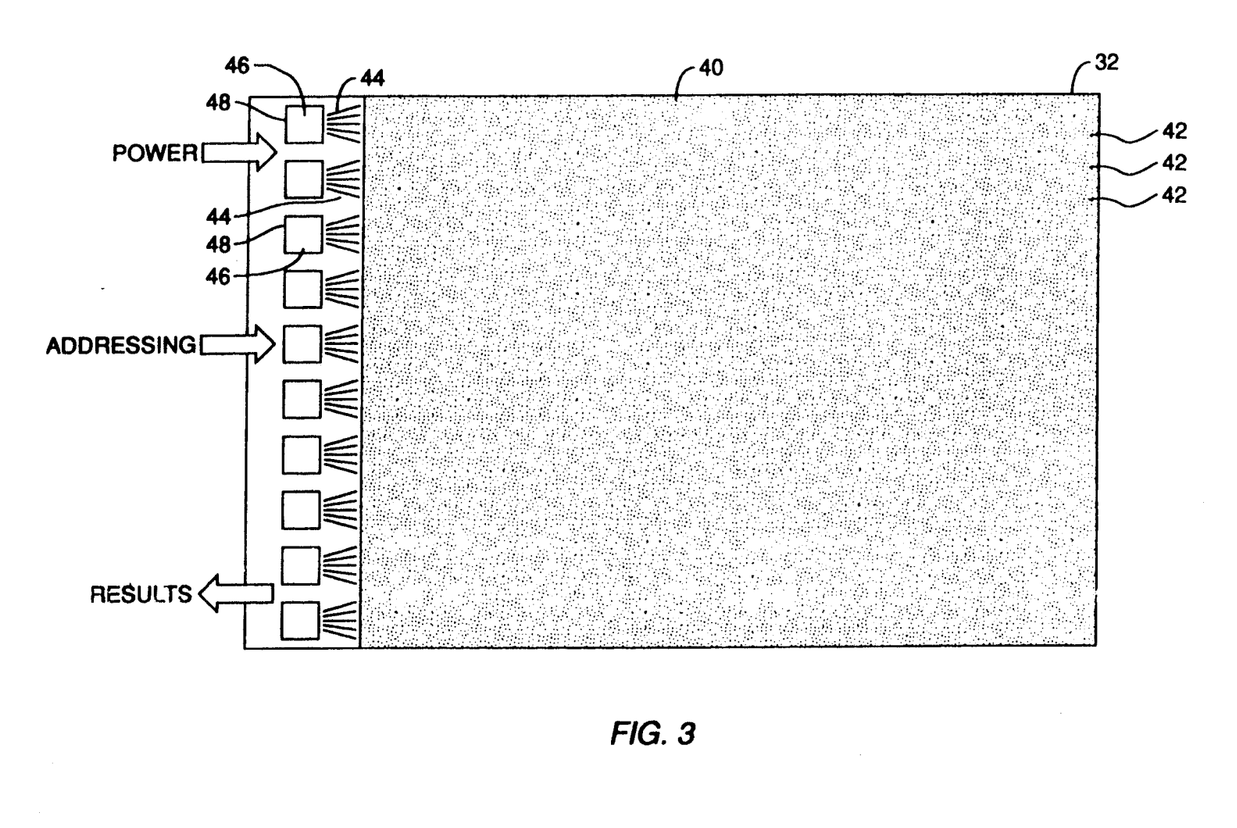
FIG. 3 is a top plan-view of the node matrix of FIG. 2.

FIG. 3 illustrates a top plan-view of node matrix 32. Node matrix 32 includes a contact node field 40 having a plurality of contact electrodes 42 and a number of data lines 44. Contact electrodes 42 are connected to each data line 44 thus forming an NxM array. Data lines 44 are aligned in parallel across node matrix 32. Each data line 44 extends the breadth of node matrix 32 and is further connected to a multiplexer 46, with each multiplexer 46 connected to a data contact pad 48. Multiplexer 46 allows each data line 44 to connect to a specific line of several possible lines available. The lines provide connection to the data line 44 for supplying either a voltage $V_{bias}$, ground, no contact (N/C), or to a measurement output device such as voltmeter, ammeter or other type electrical signal receiving device. Such power and addressing capabilities are provided through data contact pads 48.

Figure 4:
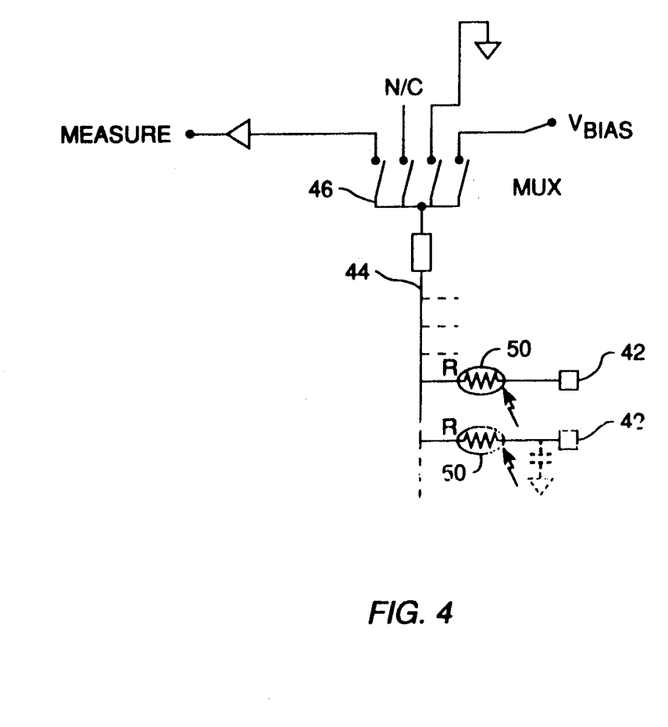
FIG. 4 is a schematic diagram of a data line in FIG. 3.

FIG. 4 illustrates a schematic diagram of each data line 44. Each electrode 42 is connected to data line 44 via a photoresistor R. Photoresistors R represent photoactive regions 50. Connected to data line 44 is multiplexer 46 that connects either $V_{bias}$, ground, no contact (N/C) or a measuring device such as a voltmeter or ammeter (as previously described), to data line 44 as programmed during a specific testing sequence. Matrix addressing control unit 24 connects with each multiplexer and provides the programming of the data lines during the testing phase. The multiplexers can be made from application specific integrated circuits (ASIC) and may also be fabricated on a glass panel (node matrix 32) using chip-on-glass (COG) technology. The ASIC multiplexers provide power, addressing and measuring capabilities for each data line 44. A capacitor C may be deposited across the electrode to ground.

Figure 5:
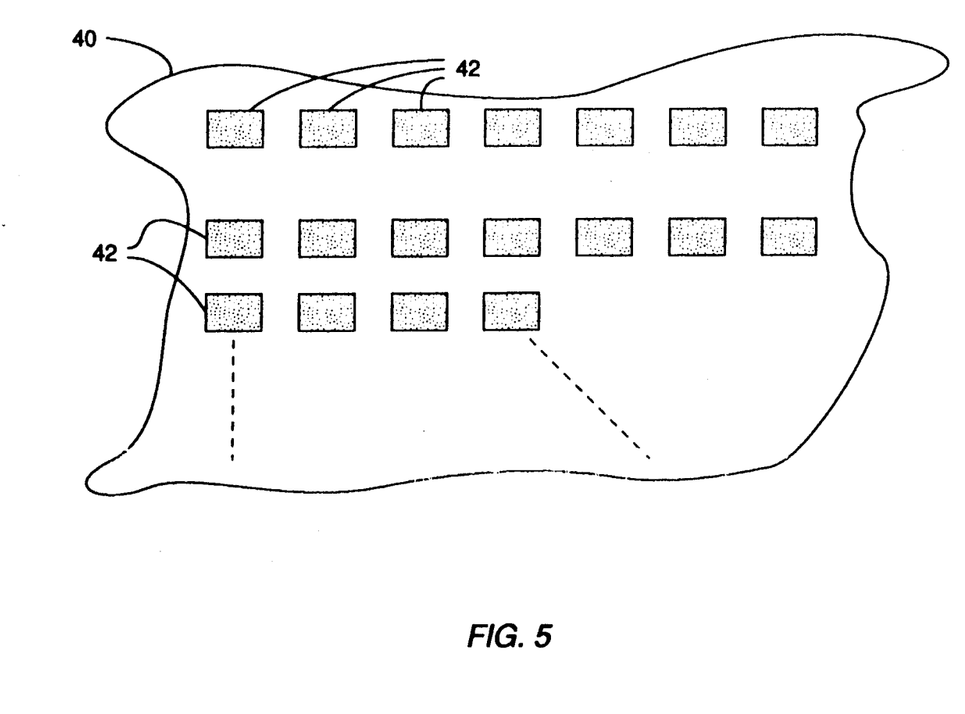
FIG. 5 is an enlarged top plan-view of the contact nodes found in node matrix of FIG. 3.

FIG. 5 is an enlarged cut-away view of contact node field 40 showing the intended row and column electrode array format. Electrodes 42 are active only if the region of the corresponding photoconductive layer is illuminated by the light source, thereby shorting across the electrodes to data line.

Figure 6:
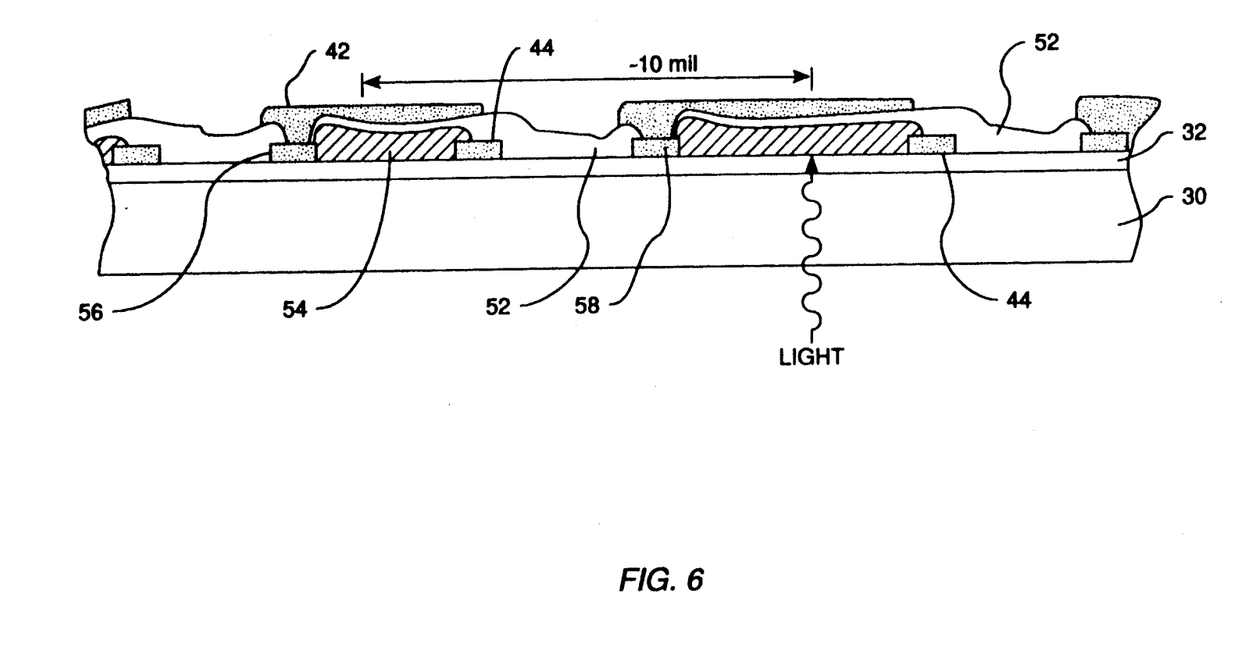
FIG. 6 is a cross-sectional view of the conductive node matrix fabricated on the glass plate in FIG. 2.

FIG. 6 shows a side cross-sectional view of node matrix 32 which is securely mounted on a thick glass plate 30. Fabricated on node matrix 32 are contact electrodes 42 formed in an N×M array. Each electrode 42 is fabricated from a conductive metal, such as aluminum, which is deposited upon a dielectric layer 52, such as silicon dioxide. Dielectric layer 52, in turn, has been fabricated on a photoconductive layer 54, such as CdSe or CdS. Photoconductive layer 54 has been fabricated so that it interconnects a conductive data line 44, which runs the breadth of the plate 12 with many electrodes via electrode contact 56. Photoconductive layer 54 is fabricated such that it becomes conductive, or switches on, when illuminated with light of an appropriate wavelength and intensity. Preferably, each electrode 42 is about 50 mils square and has a thickness of between 0.5 microns to 2.0 microns, with 1.0 micron preferred (FIG. 5). The desired pitch of each electrode 42 is approximately 10 mils. This allows for an electrode density of 10,000 electrodes per square inch. Such a density greatly exceeds the maximum density of approximately 200 probes per square inch capable in the use of "bed-of-nails" testing equipment. There may be an additional metal and insulator process step to fabricate a capacitor connected to electrode 42.

The following are the desired steps for fabricating the electrodes on the glass:

1. Deposit and pattern data line 44 and electrode contact 56 with a metallization step.
2. Deposit and pattern the photoconductive layer 54.
3. Deposit an insulating film 52.
4. Etch contact holes 58 through insulating layer 52.
5. Deposit and pattern electrode 42.
6. Mount processed glass panel onto glass plate 30.

Figure 7:
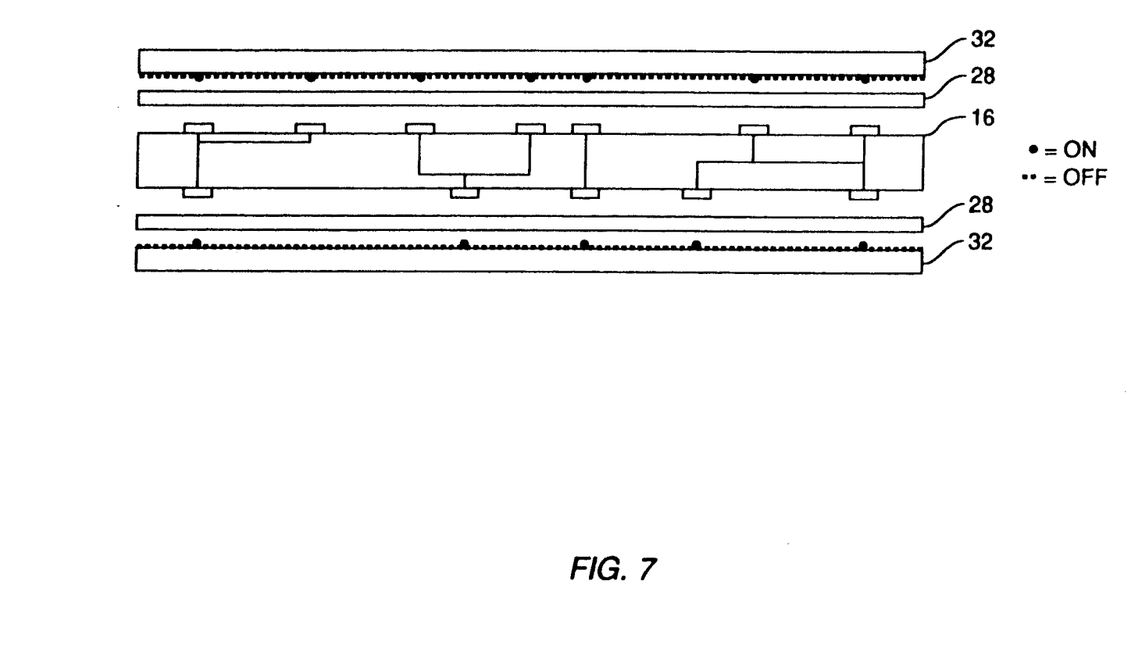
FIG. 7 is a cross-sectional expanded view of the lower matrix panel and the upper matrix panel with select activated electrodes for testing a board under test.

In operation, the test apparatus 10 is used as follows. Circuit board 16 is positioned between upper matrix panel 12 and lower matrix panel 14 with conductive mat 28 providing contact between circuit board 16 and upper and lower matrix panels 12 and 14, as shown in FIG. 7. Conductive fiducials on the board under test are used to determine the correct board alignment. They are scanned by the appropriate image patterns and measurement resources to determine the precise alignment of circuit board 16. This alignment information is reported to computer 20 to provide any rotational, translational, or scale transformation of electrodes 42 necessary due to misalignment of circuit board 16 with respect to matrix panel 12 or 14. Computer 20 then uses the pre-processed CAD data, as well as the alignment data, to generate an image pattern for each upper and lower matrix panels 12 and 14.

The image pattern is processed through matrix addressing control unit 24 before reaching the two matrix panels 12 and 14. Computer 20 also operates a multiplexer pattern for determining the proper connection to be made to the appropriate electrodes. This information is also forwarded to matrix addressing control unit 24. Next, LCD projection panels 34 display a testing pattern corresponding to the pattern desired to be tested on circuit board 16. Laser diodes 36 illuminate node matrix 32 by projecting the desired image pattern on projection panels 34 onto node matrix 32. Laser diodes 36 are signalled by laser pulse sequencer 22 to match the image pattern sequence of projection panels 34. Each photoactive region 50 illuminated switches a corresponding electrode 42, thus applying the desired signal across electrodes 42 to select locations on circuit board 16 (FIG. 7). The results of the applied signal are also observed by upper and lower matrix panels 12 and 14 and forwarded to measure control unit 26. Measure control unit 26 then uses the results to indicate to computer 20 to begin processing the next test frame in the desired test sequence.

Prior probe panels had to be custom built for the specific circuit board to be tested. These custom-designed probe panels, called "fixtures," are very expensive and are limited to use with only the circuit boards for which they were designed. The present invention provides a probe panel having an electrode density nearly 100 times that currently available. In addition, the probe panel is software addressable so that the CAD software design used to build a specific circuit board can also be used to build a software "fixture" panel for use in testing apparatus 10. An advantage of software fixturing is that a single probe system has greater flexibility possible than the mechanical fixture boards by being able to test a great variety of circuit boards, of which no two are alike.

Standard video imaging technology allows as many as thirty different test patterns to be cycled per second. This allows thirty measurement schedules per second. Thus, for example, in an array of 100×100 electrodes (10,000 electrodes total), each conducting path from one point to another point on circuit board 26 forms a network, and 100 such networks could be adequately tested during each frame or schedule. This rate yields approximately 3,000 networks tested per second. Such an arrangement means that a complete circuit board test of a circuit board having 10,000 test points would require less than five seconds.

Two well known tests performed on circuit boards are testing for continuity and testing for isolation. Both are possible with the present invention. There are two methods for testing for continuity. The first method merely tests to determine the continuity of a given path between two points on a circuit board. The second method uses a Kelvin probe to establish both continuity and the resistivity of a given path between two points on the circuit board. The test for isolation is done merely to determine whether a given path between at least two points is not shorted to another path on the circuit board.

The invention has now been explained with reference to a specific embodiment. Other embodiments will be apparent to those of ordinary skill in the art. For example, though printed-circuit boards have been used repeatedly as the test board, other types of computer boards such as ceramic, epoxy-glass and injection-molded plastic can also be tested using the disclosed apparatus. It is therefore not intended that the invention be limited except as indicated by the appended claims.

What is claimed is:

1. A probe apparatus for testing bare or partially assembled circuit boards comprising:

a first probe panel for providing addressable contact to a circuit board under test, said panel having a first plurality (N) of electrically conductive first strips, and each first strip having a second plurality (M) of first electrodes to form a first electrode array;

first switching means coupled to each one of said first electrodes for providing an outside contact to a corresponding first electrode though said first strip, said first switching means comprising a photoelectric switch sensitive to incident photoelectric energy to conduct between said first strip and selected ones of said first electrodes; and first means for selectively photoelectrically activating each said photoelectric switch.

2. The apparatus according to claim 1 further including:

a second probe panel for providing addressable contact to said circuit board under test, said panel having a first plurality (N) of electrically conductive second strips, and each second strip having a second plurality (M) of second electrodes to form a second electrode array;

second switching means coupled to each one of said second electrodes for providing an outside contact to a corresponding second electrode though said second strip, said second switching means comprising an photoelectric switch sensitive to incident photoelectric energy to conduct between said second strip and selected ones of said second electrodes; and second means for selectively photoelectrically activating each said photoelectric switch.

3. The apparatus according to claim 1 wherein said first activating means comprises a light valve having an array of N×M pixels having a form factor scalably matching positions of said switching means of said electrode array and a photoelectric source for passing photoelectric energy through said light valve onto said switching means.

4. The apparatus according to claim 2 wherein said first activating means comprises a light valve having an array of N×M pixels having a form factor scalably matching positions of said switching means of said electrode array and a photoelectric source for passing photoelectric energy through said light valve onto said switching means.

5. The apparatus according to claim 4 wherein said light valve is a liquid crystal display (LCD) projection panel.

6. The apparatus according to claim 4 wherein said light source is a laser diode.

7. The apparatus according to claim 4 wherein said light valve is a LCD panel having a secondary light source.

8. The apparatus according to claim 4 wherein said light valve is coupled to a programmable signal driving device for supplying a preselected excitation pattern to activate electrodes of said probe panel.

9. The apparatus according to claim 4 wherein said light valve is an optical shutter having a white light source.

10. The apparatus according to claim 1 wherein said activating means includes an individual light source for each photoelectric switch.

11. The apparatus according to claim 1 wherein said outside contact is selected from a voltage source, a ground contact, a voltmeter, and an ammeter.

12. The apparatus according to claim 1 further including means for electrically coupling each said electrode to selected locations of said circuit board under test.

13. The apparatus according to claim 12 wherein said electrically coupling means comprises conductive filaments embedded in an elastomeric sheet forming an electroconductive mat, wherein said elastomeric sheet provides insulation along the plane of the electroconductive mat and said embedded filaments provide conduction in the direction substantially perpendicular to the plane of the electroconductive mat.

14. A probe apparatus for testing circuit boards comprising:
 first and second probe panels for providing addressable lines to a circuit board under test, said first and second panels having a first plurality (N) of strips, and each strip having a second plurality (M) of electrodes to form an electrode array;
 coupling means for selectively coupling said electrodes of said strips to a plurality of said addressable lines;
 switching means coupled between each one of said electrodes and one of said strips, said switching means comprising photoelectric switches sensitive to incident photoelectric energy to conduct between said strip and said electrode; and
 means for selectively photoelectrically activating said photoelectric switches.

15. The test apparatus according to claim 14 wherein said coupling means is a multiplexer.

16. The test apparatus according to claim 14 wherein said addressable lines are connected to means selected from the group consisting of a voltage source, a ground, a voltmeter and an ammeter.

17. The apparatus according to claim 14 wherein said activating means comprises a light valve having an array of N×M pixels having a form factor scalably matching positions of said switching means of said electrode array and a photoelectric source for passing photoelectric energy through said light valve onto said photoelectric switches.

18. The apparatus according to claim 17 wherein said light valve is a liquid crystal display projection panel.

19. The apparatus according to claim 17 wherein said light source is a laser diode.

20. The apparatus according to claim 17 wherein said light valve is a LCD panel having a secondary light source.

21. The apparatus according to claim 17 wherein said light valve is coupled to a programmable signal driving device for supplying a preselected excitation pattern to activate electrodes of said probe panel.

22. The apparatus according to claim 14 further including means for electrically coupling each said electrode to selected locations of said circuit board under test.

23. The apparatus according to claim 22 wherein said electrically coupling means comprises conductive filaments embedded in an elastomeric sheet forming an electroconductive mat, wherein said elastomeric sheet provides insulation along the plane of the electroconductive mat and said embedded filaments provide conduction in the direction substantially perpendicular to the plane of the electroconductive mat.

24. A method for testing a bare or partially assembled circuit board having a plurality of nodes, said method comprising the steps of:
 preparing an address matrix of selected locations conforming to positions on said circuit board;
 reproducing said address matrix on a light valve means;
 programming a set of multiplexing means on a photoelectrically addressable probe panel to address preselected data lines connected to selected multiplexing means for performing a specified function, each said data line being coupled to at least one electrode via a photoelectric switch; and
 passing photoelectric energy through said light valve means onto said probe panel to activate a pattern of said electrodes based on said selected locations of said address matrix, thereby electrically activating a pattern of said nodes having a form factor substantially complying with said address matrix.

25. The method according to claim 24 further including the step of detecting electrical signals applied to said circuit board via a portion of said electrodes.

26. The method according to claim 24 wherein said address matrix is scalable on said light valve means.

27. A method of testing a bare or partially assembled circuit board having a plurality of nodes, said method comprising the following steps:
 creating an image of an array of addressable locations corresponding to selected ones of said nodes as an optical address matrix;
 projecting said optical address matrix upon a panel comprising a matrix of photoelectric switches to cause switching of said matrix of photoelectric switches to apply a signal to said selected nodes via a first group of electrodes connected to said photoelectric switches by photoelectric application of said optical address matrix to said photoelectric switch matrix; and
 detecting a response to said signal via a second group of electrodes connected to said photoelectric switches through said photoelectric switch matrix which has been enabled by said optical address switch matrix.

28. The method according to claim 27 wherein said address matrix is scalable on said light valve means.

* * * * *